(12) United States Patent
Sai

(10) Patent No.: US 10,884,236 B2
(45) Date of Patent: Jan. 5, 2021

(54) OPTICAL DEVICE, PROJECTION OPTICAL SYSTEM, EXPOSURE APPARATUS USING THE SAME, AND METHOD FOR MANUFACTURING ARTICLE

(71) Applicant: CANON KABUSHIKI KAISHA, Tokyo (JP)

(72) Inventor: Choshoku Sai, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 148 days.

(21) Appl. No.: 16/033,104

(22) Filed: Jul. 11, 2018

(65) Prior Publication Data

US 2019/0041631 A1    Feb. 7, 2019

(30) Foreign Application Priority Data

Aug. 1, 2017 (JP) ................................. 2017-149540

(51) Int. Cl.
| | |
|---|---|
| *G02B 26/08* | (2006.01) |
| *G02B 27/00* | (2006.01) |
| *G03B 21/28* | (2006.01) |
| *G02B 27/09* | (2006.01) |
| *G03F 7/20* | (2006.01) |

(52) U.S. Cl.
CPC ..... *G02B 26/0825* (2013.01); *G02B 27/0043* (2013.01); *G02B 27/0983* (2013.01); *G03B 21/28* (2013.01); *G03F 7/70266* (2013.01)

(58) Field of Classification Search
CPC ............ G02B 27/0043; G02B 26/0825; G02B 27/0983; G03F 7/70266; G03B 21/28
USPC ........................................................... 359/850
See application file for complete search history.

(56) References Cited

U.S. PATENT DOCUMENTS

| | | | |
|---|---|---|---|
| 7,771,065 B2 | 8/2010 | Sai et al. | |
| 2006/0232866 A1* | 10/2006 | Sai ..................... | G02B 26/0825 359/849 |

FOREIGN PATENT DOCUMENTS

| | | |
|---|---|---|
| CN | 105093848 A | 11/2015 |
| CN | 105372942 A | 3/2016 |
| JP | 2006295023 A | 10/2006 |
| JP | 2007316132 A | 12/2007 |
| JP | 2015126037 A | 7/2015 |
| WO | 2016170043 A1 | 10/2016 |

OTHER PUBLICATIONS

M. Lloyd-Hart, et al., Adaptive optics for the 6.5 m MMT, Proceedings of SPIE, Conference No. 4007, Mar. 31, 2000, 9 pages, Munich.

* cited by examiner

*Primary Examiner* — Jade R Chwasz
(74) *Attorney, Agent, or Firm* — Canon U.S.A., Inc. IP Division

(57) ABSTRACT

An optical device includes a mirror, and a plurality of actuators configured to deform a shape of a reflecting surface of the mirror. At least some of the plurality of actuators are arranged on a plurality of concentric circles arranged in such a manner that the concentric circles are arranged denser as positions of the concentric circles are located farther from a center of the reflecting surface of the mirror, and at least some of the plurality of actuators are arranged at equal intervals in circumferential directions of the concentric circles.

10 Claims, 8 Drawing Sheets

SHAPE TO BE OBTAINED BY CORRECTION
200.9 [nmRMS]  716.1 [nmPV]

SHAPE AFTER CORRECTION DRIVING
200.6 [nmRMS]  712.3 [nmPV]

ERROR SHAPE
9.0 [nmRMS]  102.2 [nmPV]

OPTICAL DEVICE, PROJECTION OPTICAL SYSTEM, EXPOSURE APPARATUS USING THE SAME, AND METHOD FOR MANUFACTURING ARTICLE

BACKGROUND OF THE INVENTION

Field of the Invention

The disclosure relates to an optical device including a deformable mirror, a projection optical system, an exposure apparatus, and a method for manufacturing articles.

Description of the Related Art

An optical device including a deformable mirror to correct a wavefront error or image distortion is used particularly in a semiconductor exposure apparatus, a flat panel exposure apparatus, and an astronomical telescope. In recent years, a requirement for the resolution of an exposure apparatus has been increasing. Thus, a requirement for correction of exposure aberration also has been increasing. In response, to correct exposure aberration, an apparatus configuration is discussed in which an exposure apparatus includes a deformable mirror. Further, also in the astronomical field, to suppress the influence of air fluctuation on a telescope installed on the ground, a deformable mirror is increasingly used.

To reduce the influence of air fluctuation on a ground-based astronomical telescope, M. Lloyd-Hart, et al., "Adaptive optics for the 6.5 m MMT", Proceedings of SPIE, USA, SPIE, 2000, Vol. 4007, p. 167-174 discusses a configuration in which 336 voice coil motors are uniformly arranged on a back surface of a thin secondary mirror, as actuators for deforming the secondary mirror.

To reduce the influence of heat generated by actuators when a deformable mirror applied to an exposure apparatus is deformed, Japanese Patent Application Laid-Open No. 2007-316132 discusses a configuration of a deformable mirror using an electromagnet, which can generate a large force and generates relatively little heat.

However, in a configuration in which actuators are uniformly and densely arranged as in M. Lloyd-Hart, et al., "Adaptive optics for the 6.5 m MMT", Proceedings of SPIE, USA, SPIE, 2000, Vol. 4007, p. 167-174, the actuators may also be arranged at unnecessary places. This can result not only in complex manufacturing and controlling, but also in an increase in the cost of a deformable mirror. Further, Japanese Patent Application Laid-Open No. 2007-316132 illustrates an example of arrangements of actuators for correcting a 2θ component and a 3θ component of a mirror expressed by Zernike polynomials. However, Japanese Patent Application Laid-Open No. 2007-316132 does not discuss an arrangement policy and an arrangement principle existing in the example of the arrangement.

SUMMARY OF THE INVENTION

The disclosure is directed to a technique for arranging actuators on a mirror capable of achieving the desired accuracy of mirror deformation with as few actuators as possible.

According to an aspect of the disclosure, an optical device includes a mirror, and a plurality of actuators configured to deform a shape of a reflecting surface of the mirror, wherein at least some of the plurality of actuators are arranged on a plurality of concentric circles arranged such that the further away from a center on the reflecting surface of the mirror, the denser the concentric circles, and at least some of the plurality of actuators are also arranged at equal intervals in circumferential directions of the concentric circles.

Further features and aspects of the disclosure will become apparent from the following description of numerous example embodiments with reference to the attached drawings.

DESCRIPTION OF THE EMBODIMENTS

Figure 1A:
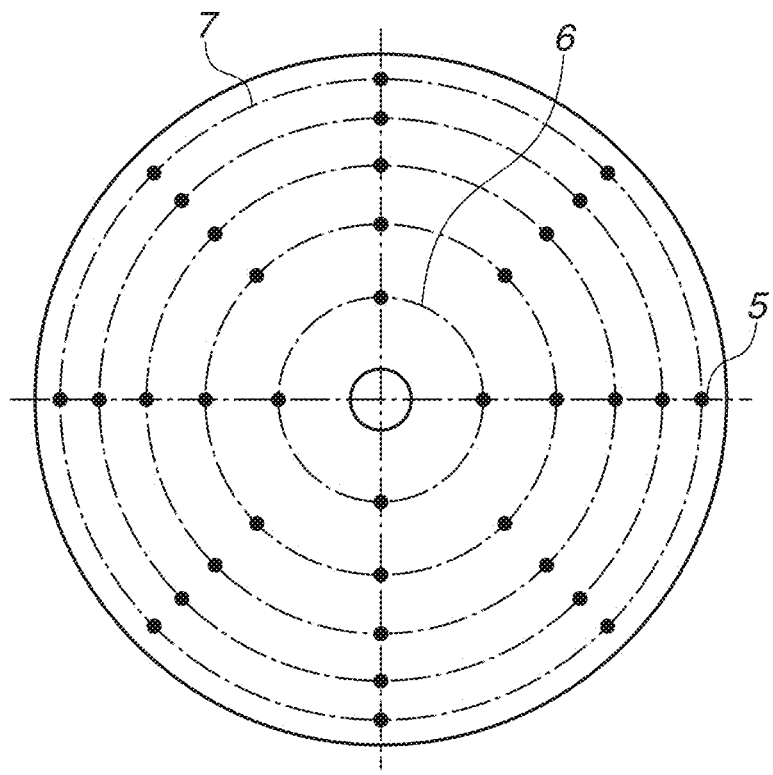
FIGS. 1A and 1B are diagrams illustrating an arrangement of driving points (actuator arrangement) according to a first example embodiment.

According to an aspect of the disclosure, at least some of a plurality of actuators for deforming a shape of a reflecting surface of a mirror are arranged on a plurality of concentric circles arranged in such a manner that the actuators are arranged on the concentric circles denser as the positions are farther from a center of the reflecting surface of the mirror, and at least some of the plurality of actuators are also arranged at equal intervals in circumferential directions of the concentric circles. "Dense" means that the further outward in a radial direction, the smaller the distances in the radial direction between the concentric circles. This arrangement policy is intended to find effective arrangement positions of the actuators for correcting the shape of the reflecting surface of the mirror, thereby achieving both high accuracy of mirror deformation and a small number of actuators to be arranged. As the effective arrangement positions of the actuators, effective arrangement places of the actuators in the radial direction of the mirror are searched with reference to expressions (e.g., Zernike polynomials) expressing a target shape of the mirror, and the rotational symmetry of the shape of the mirror is taken into consideration in the circumferential directions. Generally, to prescribe the shape of a portion around the outer periphery of a mirror with high precision, the concept of the maximum spatial frequency regarding the distances between the arrangement positions of actuators is necessary, and it is desirable to arrange the actuators at the minimum driving point interval near the outer periphery of the mirror. Thus, it is desirable to arrange the actuators in such a manner that the actuators are arranged denser as the positions are farther from the center of the mirror. In addition, it is desirable to arrange the actuators most densely in an outer peripheral portion of the mirror. The arrangement of the actuators at equal intervals in the circumferential directions of the concentric circles is more effective in a case where the shape of the mirror viewed from a direction perpendicular to the reflecting surface is a circular shape having rotational symmetry with an infinite number of symmetries. Further, from this viewpoint, it is desirable that the overall arrangement of the plurality of actuators should be rotationally symmetric.

Numerous example embodiments of the disclosure will be described in detail below with reference to the attached drawings. First, terms used to prescribe an aspect of the disclosure are defined. "Equal intervals" in a circumferential direction are defined as follows. In an ideal case, a plurality of actuators arranged in the same circumferential direction are arranged at geometrically equal intervals La. However, there are many cases where it is difficult to accurately arrange the plurality of actuators at ideal positions for reasons such as the processing and the assembling of an apparatus and the like. Thus, "equal intervals" also include a case where the amount of positional shift of an actuator is within ±30% of each of the geometrically equal intervals La.

Further, "near" in "near an extremum" and "near an inflection point" used in the present specification refer to the fact that the amount of positional shift of an actuator from an ideal position in a radial direction is within 30% of an interval Lb between actuators adjacent to each other. The reason for defining the amount of positional shift in the term "equal intervals" as being within ±30% (within the range between −30% and 30%), and the reason for defining the amount of positional shift in the term "near" as being within 30% will be described with reference to FIG. 8 after the example embodiments are described.

Figure 1B:
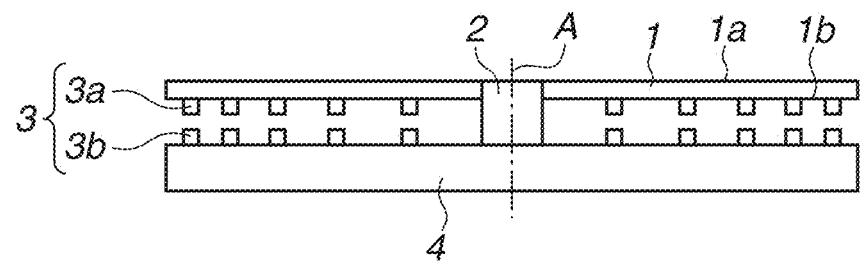

FIGS. 1A and 1B are schematic diagrams illustrating a configuration of an optical device 10 according to a first example embodiment. FIG. 1A illustrates a top view of the optical device 10. FIG. 1B illustrates a cross-sectional (front) view of the optical device 10. The optical device 10 is a deformable mirror device capable of deforming the mirror 1, specifically, deforming a reflecting surface 1a of the mirror 1 into a desired target shape. The optical device 10 can include the mirror 1, a holding member 2, a base plate 4, and actuators 3.

The mirror 1 with an optical axis A is fixed to the base plate 4 via the holding member 2. Between the mirror 1 and the base plate 4, the plurality of actuators 3 for deforming the shape of the reflecting surface 1a of the mirror 1 into a desired shape are arranged. Each of the actuators 3 according to the present example embodiment can include a voice coil motor (VCM) composed of a magnet 3a, which is attached to a back surface 1b of the mirror 1, and a coil 3b, which is attached to the base plate 4. The mirror 1 has a planar shape that is circular when viewed from a direction perpendicular to the reflecting surface 1a, and a central axis passing through the center of the mirror 1 and perpendicular to the planar shape is the optical axis A. Alternatively, the mirror 1 may be a concave mirror in which the reflecting surface 1a has a concave shape, or may be a convex mirror in which the reflecting surface 1a has a convex shape. In other words, the mirror 1 can be configured in such a manner that the reflecting surface 1a has any one of a planar shape, a concave shape, and a convex shape.

Driving points 5 represent the positions of the actuators 3. The driving points 5 are arranged on a plurality of concentric circles of the mirror 1, and the plurality of concentric circles are arranged in such a manner that the concentric circles are arranged denser as they are located farther away from the optical axis A, which passes through the center of the mirror 1. The concentric circle indicated by the innermost dashed-dotted line and the concentric circle indicated by the outermost dashed-dotted line represent an inner optical effective area boundary 6 and an outer optical effective area boundary 7, respectively. Further, the actuators 3 are arranged at equal intervals in a circumferential direction at the same radius. Further, the actuators 3 are arranged in an aligned manner in a radial direction, and the overall arrangement of the plurality of actuators 3 has 90-degree rotational symmetry.

Further, the mirror 1 can be held by, for example, a ring-shaped intermediate member via elastic members having spring properties. The elastic members are provided, for example, at 120° intervals at three positions on the same circumference in an outer peripheral portion of the mirror 1. The intermediate member has high stiffness and is driven in XYZ axis directions or in rotational directions (tilt directions) about the XYZ axes by another actuator that is different from the actuators 3 and provided between the intermediate member and the base plate 4. The position of the mirror 1 can be measured by a measurement unit such as a displacement gauge and adjusted by driving another actuator based on the measurement result. With this configuration, it is possible to control the position and the orientation of the mirror 1. Further, the shape of the reflecting surface 1a of the mirror 1 is also measured by a laser interferometer, and the reflecting surface 1a of the mirror 1 is deformed into a target shape by driving and controlling the actuators 3 based on the difference between the measured value and a target shape value. In this case, based on the difference between the measured value and the target shape value, a controller (not illustrated) calculates the force required to deform the reflecting surface 1a and supplies currents to the coils 3b of the actuators 3 to generate the calculated force. Further, using an ammeter (not illustrated), the controller measures the current value of the current to be applied to each coil 3b and performs feedback control based on the measurement result.

Example 1

Next, using calculation examples, the effects of example 1 according to the first example embodiment are described. The specifications of the mirror 1 in a calculation model are illustrated in a table 1. In the table 1, an effective inner diameter corresponds to the inner optical effective area boundary 6, and an effective outer diameter corresponds to the outer effective area boundary 7.

TABLE 1

Specifications of Calculation Model

| Material of mirror | Outer diameter of mirror | Effective outer diameter | Effective inner diameter | Thickness of mirror |
| --- | --- | --- | --- | --- |
| Quartz | 320 mm | 300 mm | 90 mm | 4 mm |

In the present example embodiment, based on the maximum spatial frequency to be obtained by correction (the minimum interval between driving points required to achieve desired shape accuracy), the minimum driving point interval is 21 mm. More specifically, in a target shape composed of terms Z1 to Z16 of Zernike polynomials used in simulation examples in FIGS. 2A to 2F described below, the minimum driving point interval is determined based on the term Z16, which has the maximum spatial frequency. For example, the minimum driving point interval can be obtained from the distance between a point indicated by the rightmost black circle and a point indicated by the second black circle from the right on a curve indicated by a dashed line in FIG. 4. Further, the target to achieve is that an error shape, which is a difference shape between the shape of the mirror 1 to be obtained by correction and the shape after correction driving, is within 10 nm on a root mean square (RMS) base. As described above, generally, the maximum spatial frequency is necessary to represent the shape of a portion near the outer periphery of a mirror. Thus, a minimum driving point interval of 21 mm in the present example embodiment is also assumed to be an interval near the outer periphery of the mirror 1.

Then, consider a comparative example where driving points are uniformly arranged almost at 21-mm intervals. In the comparative example, from a table 2, the total of the driving points is 168, and 168 actuators are required. This numerical value is obtained by totaling the number of actuators to be arranged in circumferential directions from the first to sixth circles.

TABLE 2

Comparative Example of Uniform Arrangement: Positions and Number of Driving Points to Be Arranged

| | First circle | Second circle | Third circle | Fourth circle | Fifth circle | Sixth circle |
|---|---|---|---|---|---|---|
| Arrangement diameter | 90 mm | 132 mm | 174 mm | 216 mmm | 258 mm | 300 mm |
| Number of driving points to be arranged in circumferential direction | 8 | 16 | 24 | 32 | 40 | 48 |

On the other hand, in the example 1, to which the arrangement idea of the disclosure is applied, it is understood that from a table 3, the total of driving points where actuators are arranged is 136, and 136 actuators are required. This numerical value is obtained by totaling the number of actuators to be arranged in circumferential directions from the first to fifth circles. As can be understood from the table 3, the arrangement places of the actuators become gradually denser as the positions are located farther outward in a radial direction.

TABLE 3

Example of Arrangement Based on Arrangement Method According to the Present Example Embodiment: Positions and Number of Driving Points to Be Arranged

| | First circle | Second circle | Third circle | Fourth circle | Fifth circle |
|---|---|---|---|---|---|
| Arrangement diameter | 90 mm | 153 mm | 209 mm | 258 mmm | 300 mm |
| Number of driving points to be arranged in circumferential direction | 8 | 16 | 24 | 40 | 48 |

Figure 2C:
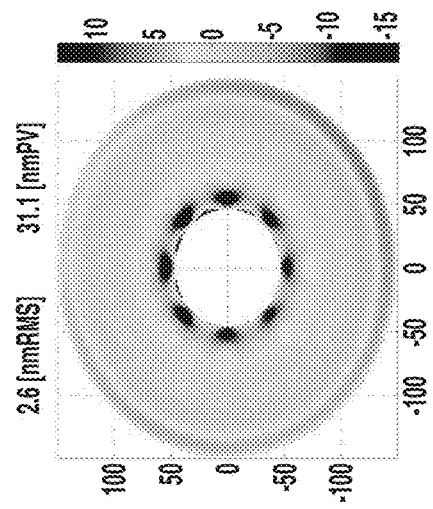
FIGS. 2A, 2B, 2C, 2D, 2E, and 2F are diagrams illustrating calculation results according to an Example 1 of the first example embodiment.
Figure 2B:
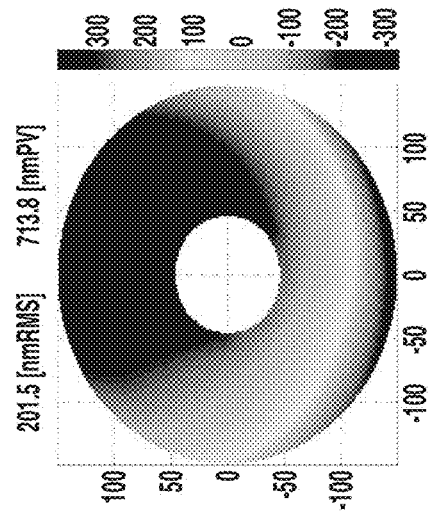
Figure 2A:
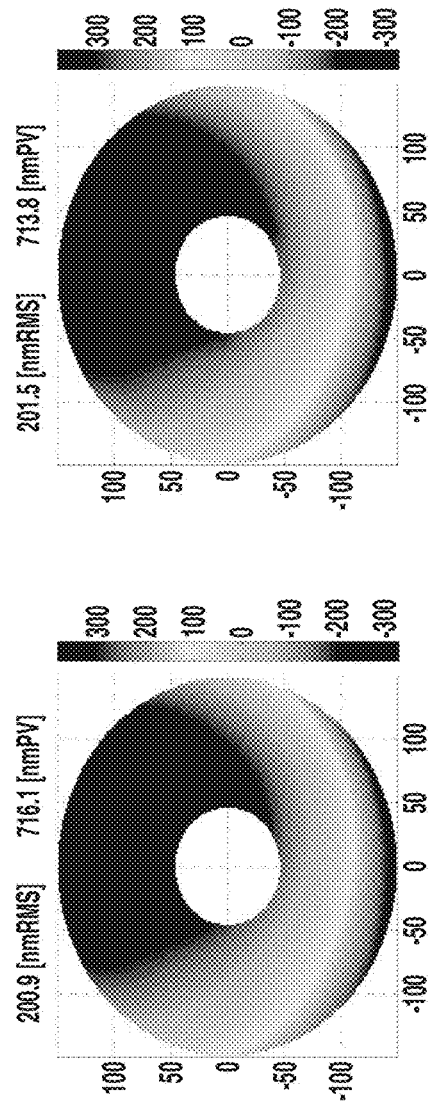
Figure 2F:
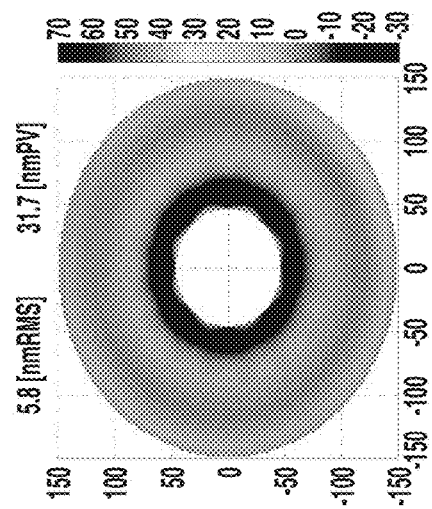
Figure 2E:
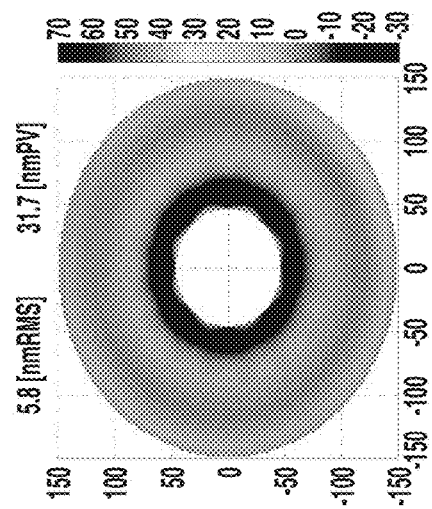
Figure 2D:
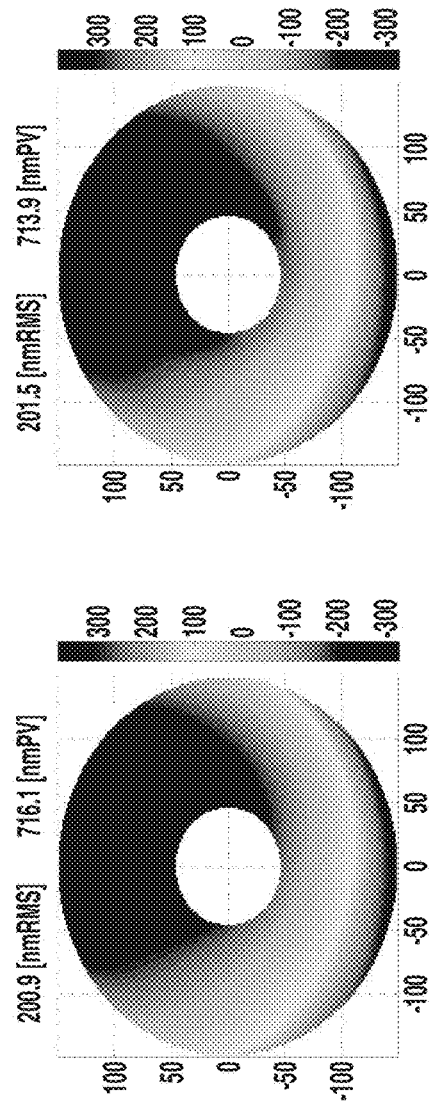

FIGS. 2A, 2B, 2C, 2D, 2E, and 2F illustrate simulation results of deformation driving in the tables 2 and 3. FIGS. 2A to 2C illustrate a result of the example of the actuator arrangement at 168 points (comparative example). FIGS. 2D to 2F illustrate a result of the example of the actuator arrangement at 136 points (example 1). Three diagrams in the same row illustrate the shape to be obtained by correction, the shape after correction driving, and a difference shape between both shapes. The shape to be obtained by correction (target shape) is a shape created by randomly generating coefficients when expansions are performed in Zernike polynomials, which are commonly used in the optical field.

Zernike polynomials are orthogonal polynomials where a circular area forms a complete system, and is a good match with a lens and a mirror, which often have circular shapes. For this reason, the Zernike polynomials are commonly used in the optical field. In the present specification, however, Zernike polynomials are used not to represent optical aberration but to represent the shape of a mirror. Thus, the shape of a mirror can be represented by, for example, the following expression (1).

$$S(r,\theta) = \Sigma C_i \cdot Z_i \quad (1)$$

In expression (1), Ci represents a coefficient of each term of the Zernike polynomials, Zi represents each term of the Zernike polynomials, and i represents the degree of the Zernike polynomials. Terms up to the 36th term of the Zernike polynomials are represented in a polar coordinate system r-θ, as the following expression (2).

$Z1 = 1$ $Z2 = r\cos(\theta)$ $Z3 = r\sin(\theta)$ $Z4 = 2r^2 - 1$ $Z5 = r^2\cos(2\theta)$ $Z6 = r^2\sin(2\theta)$ $Z7 = (3r^3 - 2r)\cos(\theta)$ $Z8 = (3r^3 - 2r)\sin(\theta)$ $Z9 = (6r^4 - 6r^2 + 1)$ $Z10 = r^3\cos(3\theta)$ $Z11 = r^3\sin(3\theta)$ $Z12 = (4r^4 - 3r^2)\cos(2\theta)$ $Z13 = (4r^4 - 3r^2)\sin(2\theta)$ $Z14 = (10r^5 - 12r^3 + 3r)\cos(\theta)$ $Z15 = (10r^5 - 12r^3 + 3r)\sin(\theta)$ $Z16 = (20r^6 - 30r^4 + 12r^2 - 1)$ $Z17 = r^4\cos(4\theta)$ $Z18 = r^4\sin(4\theta)$ $Z19 = (5r^5 - 4r^3)\cos(3\theta)$ $Z20 = (5r^5 - 4r^3)\sin(3\theta)$ $Z21 = (15r^6 - 20r^4 + 6r^2)\cos(2\theta)$ $Z22 = (15r^6 - 20r^4 + 6r^2)\sin(2\theta)$ $Z23 = (35r^7 - 60r^5 + 30r^3 - 4r)\cos(\theta)$ $Z24 = (35r^7 - 60r^5 + 30r^3 - 4r)\sin(\theta)$ $$Z25=(70r^8-140r^6+90r^4-20r^2+1)$$

$$Z26=r^5\cos(5\theta)$$

$$Z27=r^5\sin(5\theta)$$

$$Z28=(6r^6-5r^2)\cos(4\theta)$$

$$Z29=(6r^6-5r^2)\sin(4\theta)$$

$$Z30=(21r^7-30r^5+10r^3)\cos(3\theta)$$

$$Z31=(21r^7-30r^5+10r^3)\sin(3\theta)$$

$$Z32=(56r^8-105r^6+60r^4-10r^2)\cos(2\theta)$$

$$Z33=(56r^8-105r^6+60r^4-10r^2)\sin(2\theta)$$

$$Z34=(126r^9-280r^7+210r^5-60r^3+5r)\cos(\theta)$$

$$Z35=(126r^9-280r^7+210r^5-60r^3+5r)\sin(\theta)$$

$$Z36=(252r^{10}-630r^8+560r^6-210r^4+30r^2-1) \quad (2)$$

In each of the examples of FIGS. 2A and 2D, a target shape S is created by taking Z1 to Z16 of the Zernike polynomials into account, generating random numbers as coefficients C1 to C16 of Z1 to Z16 according to a normal distribution, and substituting the values of the coefficients C1 to C16 into expression (1). More specifically, the shape S is created from the values of random numbers generated when the average value of the normal distribution is 0, the deviation value of C1 to C4 is 100 nm, and the deviation value of C5 to C16 is 25 nm.

In the example of the actuator arrangement at 168 points, the error shape, which indicates the correction capability of a deformable mirror, is 2.6 nm based on RMS. In the example of the actuator arrangement at 136 points, the error shape is 5.8 nm based on RMS. In this way, both error shapes satisfy a target value, i.e., 10 nm or less, which is the target value. Further, both error shapes also satisfy a precondition, i.e., a minimum driving point interval of 21 mm. At this time, the minimum driving point interval in the actuator arrangement at 136 points is the interval between the fifth and fourth circles and is (300−258)/2=21 mm from the table 3. This means that in the example of the actuator arrangement at 168 points (comparative example), excessive driving points are arranged, and therefore, extra actuators are attached.

Using a method according to the first example embodiment or example 1 of the disclosure, it is possible to reduce the number of driving points. As a result, it is possible to reduce the complexity of processing and assembling. Further, it is also possible to reduce the complexity of a control system. Further, as a result, it is also possible to reduce the costs of the manufacture and the operation of a deformable mirror. In the present example embodiment, an example of the arrangement of driving points has been described. The disclosure, however, is not limited to this. For example, although it is desirable that the arrangement of the actuators near the outer periphery should be on the optical area boundary, the actuators may be arranged near the optical area boundary. Further, although the actuators have been described using VCMs as examples, other actuators (e.g., bimorphs arranged on the back surface of the mirror) may be used.

Figure 3A:
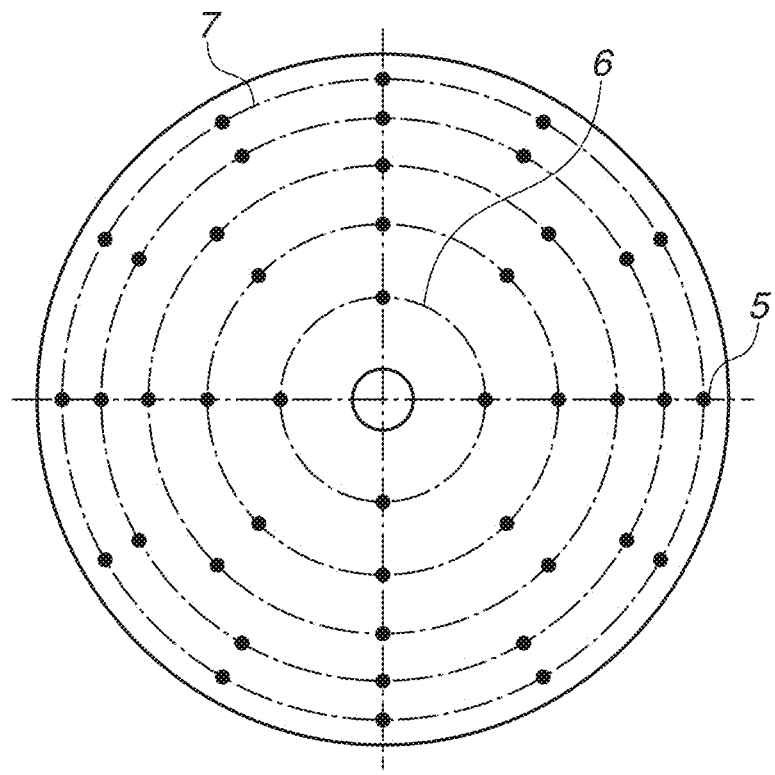
FIGS. 3A and 3B are diagrams illustrating an arrangement of driving points (actuator arrangement) according to a second example embodiment.
Figure 3B:
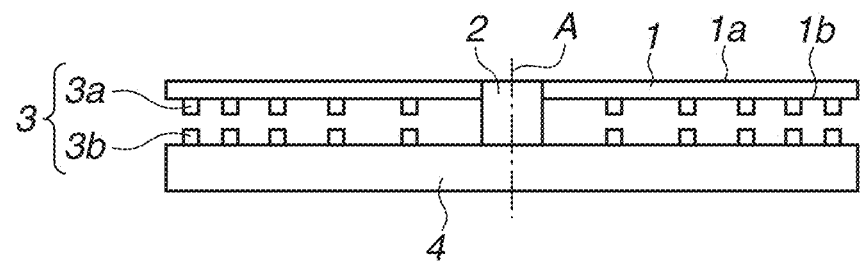
Figure 4:
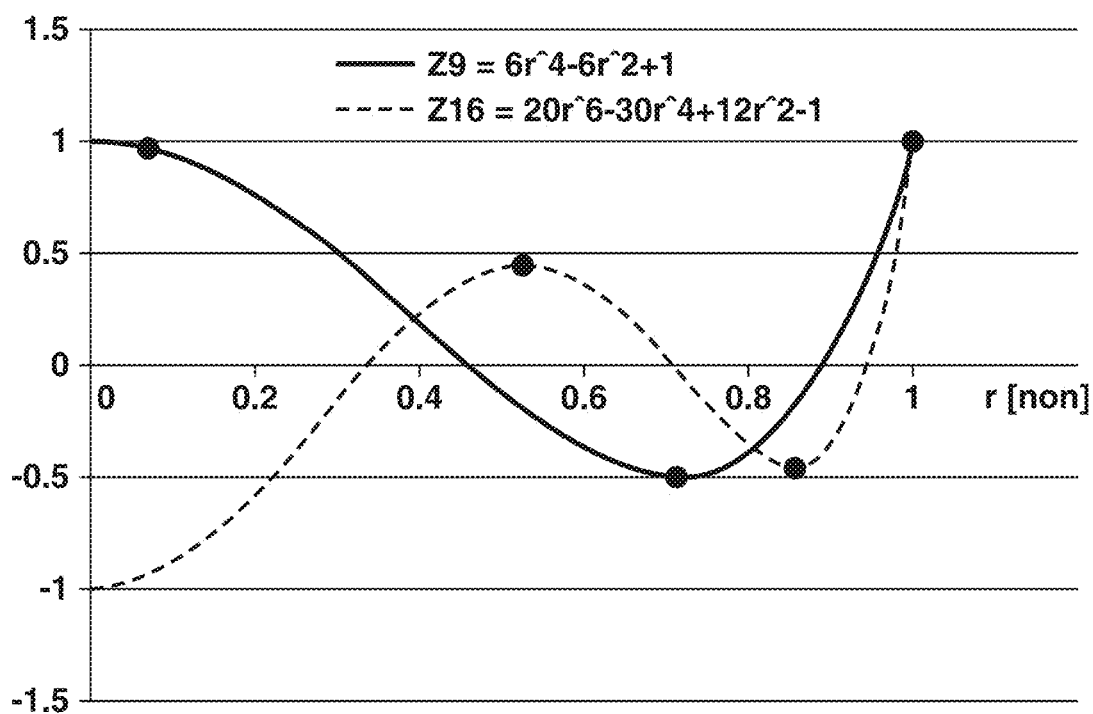
FIG. 4 is a diagram illustrating a method for arranging the driving points in a radial direction according to the second example embodiment.

Next, with reference to FIGS. 3A, 3B, and 4, a description is given of an arrangement method for arranging driving points according to a second example embodiment. FIGS. 3A and 3B illustrate an example where driving points are arranged on optical area boundaries of the shape to be obtained by correction, and at or near extrema of the shape to be obtained by correction. It is further noted that, the same signs refer to the same members or components in all Figs. The same members or components have been described in the first example embodiment, and therefore are not described here. In the present example embodiment, to correct the shape, driving points are arranged at or near effective positions (extrema). This arrangement, however, is consistent with the idea of arranging actuators in such a manner that the actuators are arranged denser as the positions exist closer to the outer periphery in the first example embodiment. Also in the present example embodiment, the overall arrangement of the plurality of actuators has 90-degree rotational symmetry.

In FIG. 4, two curves represent terms Z9 and Z16, which are rotationally symmetric components when the shape of the mirror 1 is expanded in Zernike polynomials. A horizontal axis r represents a radius made dimensionless by the radius of the mirror 1, and a vertical axis represents a value regarding a Zernike coefficient. Points indicated by the leftmost and rightmost black circles on the curves represent positions on or near the inner and outer optical area boundaries. Points indicated by other black circles represent points at or near extrema on the curves. According to the points indicated by the black circles in FIG. 4, the arrangement of driving points in the radial direction is determined. Further, although not illustrated in FIG. 4, also in the circumferential directions, the driving points are arranged at or near the extrema as much as possible. In this case, the driving points can be arranged as in the table 4, and the number of required actuators is 44.

TABLE 4

Example of Arrangement Based on Arrangement Method According to the Present Example Embodiment: Positions and Number of Driving Points to Be Arranged

| | First circle | Second circle | Third circle | Fourth circle | Fifth circle |
|---|---|---|---|---|---|
| Arrangement diameter | 90 mm | 158 mm | 212 mm | 258 mmm | 300 mm |
| Number of driving points to be arranged in circumferential direction | 4 | 8 | 8 | 12 | 12 |

Figure 5A:
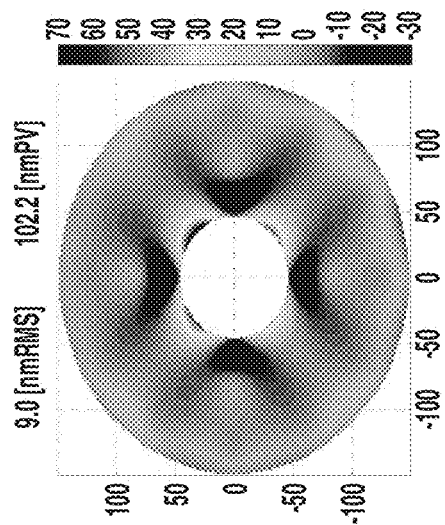
FIGS. 5A, 5B, and 5C are diagrams illustrating calculation examples according to the second example embodiment.
Figure 5B:
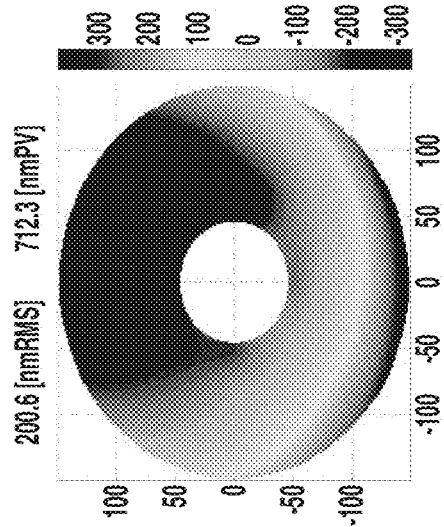
Figure 5C:
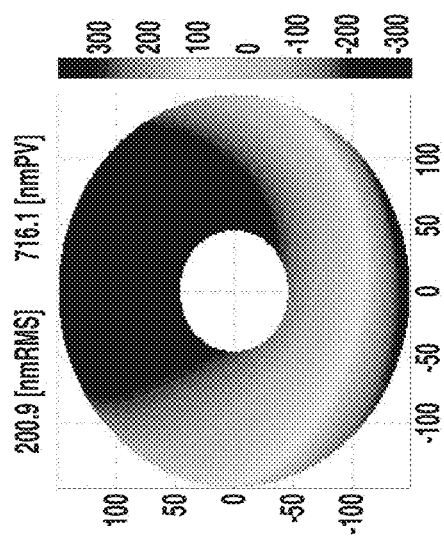

FIGS. 5A, 5B, and 5C are diagrams illustrating calculation examples according to the second example embodiment. FIGS. 5A, 5B, and 5C illustrate a shape to be obtained by correction, the shape after correction driving, and an error shape. If the shape to be obtained by correction is created based on the arrangement of driving points as in the table 4, the error shape is within a target value, i.e., 9 nm based on RMS, as illustrated in FIG. 5C. Further, the error shape also satisfies a precondition, i.e., a minimum driving point interval of 21 mm. This indicates that even if the number of actuators is decreased from 168 in the table 2 to 44, the desired objective can be achieved.

Also in the present example embodiment, the arrangement of driving points is not limited to the illustrated example. The number of driving points may be increased or decreased according to a required target (correction accuracy). Further, there is a case where it is difficult to accurately arrange or attach an actuator at an extremum or on an optical area boundary depending on the actual design. In this case, the actuator may be arranged near the extremum or near the boundary. Further, in some cases, it is difficult to arrange driving points at all the extrema due to space limitations. In such situations, driving points may be selectively arranged at or near representative extrema.

Figure 6:
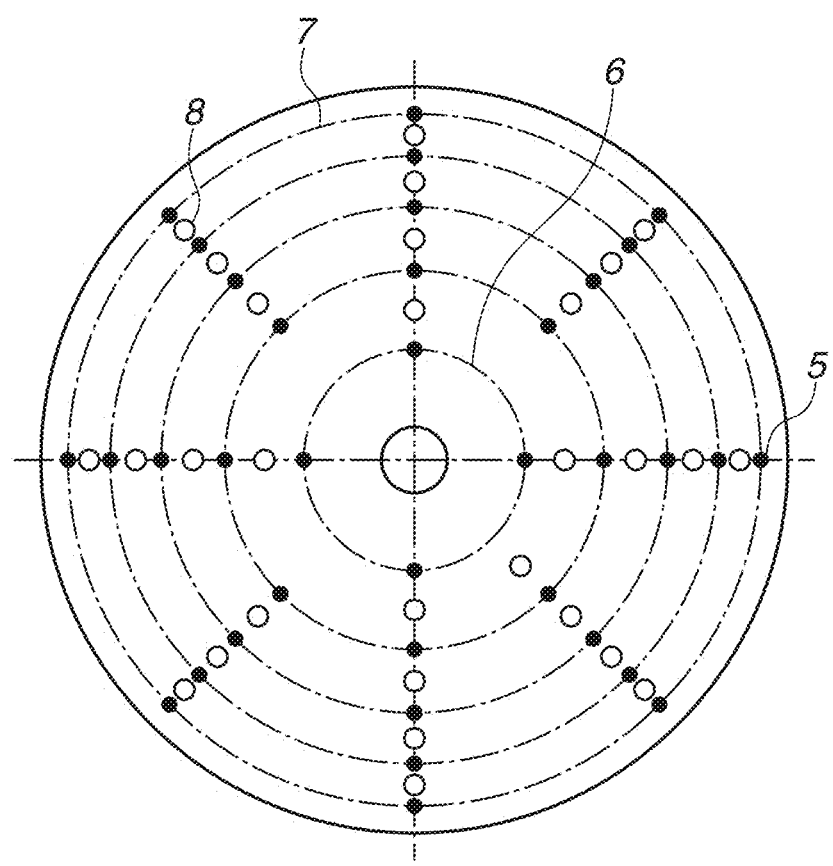
FIG. 6 is a diagram illustrating an arrangement of driving points (actuator arrangement) according to a third example embodiment.

FIG. 6 is a diagram illustrating an arrangement of driving points according to a third example embodiment of the disclosure. The third example embodiment is an example embodiment where driving points are also arranged near inflection points in the radial direction in addition to the driving points 5 in the second example embodiment illustrated in FIG. 3. In FIG. 6, points indicated by white circles represent inflection points 8. Driving points are also arranged at the inflection points 8 in addition to extrema of the shape, whereby it is possible to create a desired shape more accurately.

In the present example embodiment, an example has been described where driving points are further added to the inflection points 8 in the radial direction. Alternatively, driving points may be added to the inflection points 8 in the circumferential directions. Further, driving points may be arranged at not all the inflection points 8. It is more desirable to arrange minimum necessary driving points for achieving a target value.

In a fourth example embodiment, extrema and inflection points of a surface shape are extrema and inflection points of terms (1, 2, ..., n) of Zernike polynomials when any surface shape is represented by up to an n-th term of the Zernike polynomials. Further, generally, regarding a surface shape influencing the optical performance of an optical device, it is often only necessary to take into account up to the 64th term in Zernike polynomials. Thus, up to the 64th term may be taken into account at a maximum. More specifically, an arrangement form taking into account the 4th to 9th terms, the 4th to 10th terms, ..., or the 4th to 64th terms is possible.

Figure 7:
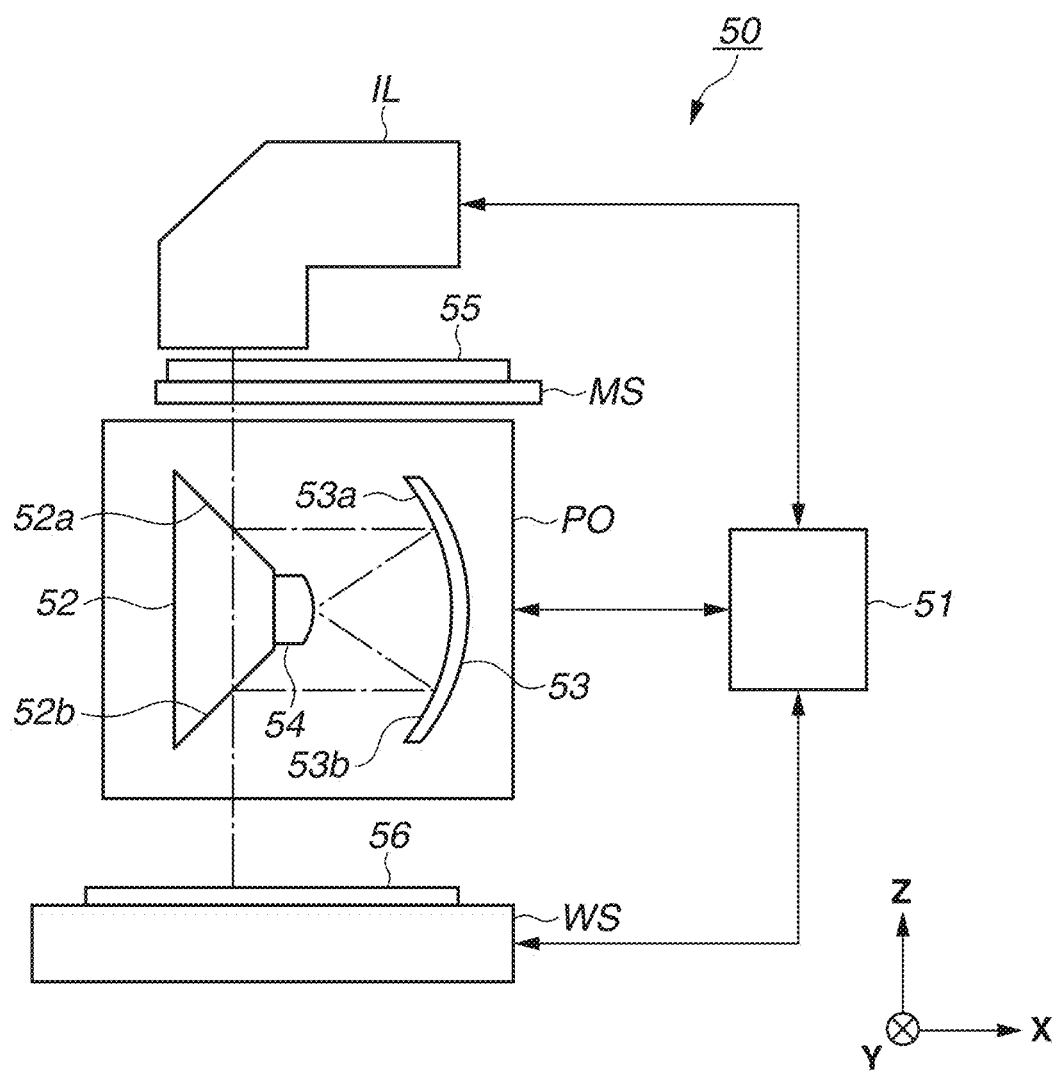
FIG. 7 is a diagram illustrating an exposure apparatus according to a fifth example embodiment.

With reference to FIG. 7, an exposure apparatus 50 according to a fifth example embodiment is described. The exposure apparatus 50 can include an illumination optical system IL, a projection optical system PO, a mask stage MS, which holds to move a mask 55, and a substrate stage WS, which hold to move a substrate 56. Further, the exposure apparatus 50 includes a central processing unit (CPU) and a memory and also includes a control unit 51 for controlling the entire exposure apparatus 50.

Light from a light source (not illustrated) forms, for example, an arc-shaped illumination area that is long in a Y-axis direction, on the mask 55 through a slit (not illustrated) included in the illumination optical system IL. The mask 55 and the substrate 56 are held on the mask stage MS and the substrate stage WS, respectively, and arranged at positions almost optically conjugate to each other (positions of an object plane and an image plane of the projection optical system PO) via the projection optical system PO. The projection optical system PO has a predetermined projection magnification (e.g., ½ times) and projects a pattern formed on the mask 55 onto the substrate 56. Then, the projection optical system PO scans the mask stage MS and the substrate stage WS in a direction (e.g., X-axis direction in FIG. 7) parallel to the object plane of the projection optical system PO at a speed ratio according to the projection magnification of the projection optical system PO. Through this operation, the projection optical system PO can transfer the pattern formed on the mask 55 onto the substrate 56.

For example, as illustrated in FIG. 7, the projection optical system PO can include a planar mirror 52, a concave mirror 53, and a convex mirror 54. Light emitted from the illumination optical system IL and passing through the mask 55 is reflected by a first surface 52a of the planar mirror 52 and incident on a first surface 53a of the concave mirror 53. The light reflected by the first surface 53a of the concave mirror 53 is reflected by the convex mirror 54 and incident on a second surface 53b of the concave mirror 53. The light reflected by the second surface 53b of the concave mirror 53 is reflected by a second surface 52b of the planar mirror 52 and forms an image on the substrate 56. In the projection optical system PO, the convex mirror 54 is an optical pupil.

In the exposure apparatus 50, the optical device 10 according to the example embodiments described above is used as, for example, a deformable mirror device for deforming a reflecting surface of the concave mirror 53 into any shape (i.e., using the concave mirror 53 as the mirror 1). Thus, it is possible to suppress decrease in the optical performance. At this time, the control unit 51 of the exposure apparatus 50 may include a control unit (not illustrated) of the optical device 10 according to the example embodiments described above.

<Method for Manufacturing Article>

A method for manufacturing an article according to an example embodiment of the disclosure is suitable, for example, for manufacturing an article such as a micro device, e.g., a semiconductor device, or an element having a fine structure. The method for manufacturing an article according to the present example embodiment includes the process of forming a latent image pattern on a photosensitive agent applied to a substrate, using the exposure apparatus 50 (process of exposing the substrate), and the process of developing the substrate on which the latent image pattern is formed in the above process. Further, this manufacturing method includes other known processes (oxidation, film formation, deposition, doping, planarization, etching, resist removal, dicing, bonding, and packaging). The method for manufacturing an article according to the present example embodiment has an advantage compared to a conventional method in at least one of the performance, the quality, the productivity, and the production cost of the article.

Figure 8:
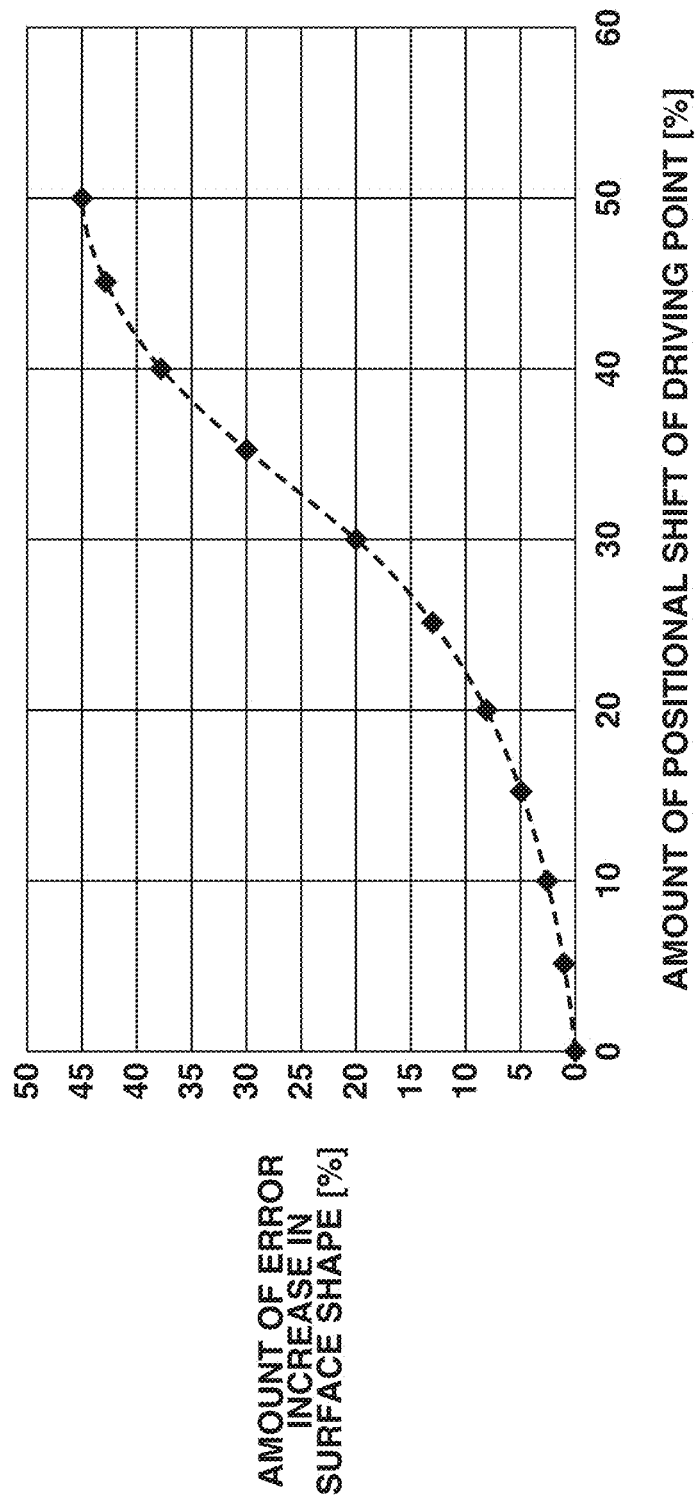
FIG. 8 is a diagram for explaining defined terms.

Lastly, with reference to FIG. 8, a description is given of the reasons for defining the range within ±30% and the range within 30% in the terms "equal intervals" and "near" in the specification. First, a target is to achieve the state where, when the positions of the driving points are shifted from accurate positions, the amount of deterioration of the surface shape of the reflecting surface falls within 20%. In this case when the positions of the driving points are shifted by about 30%, the amount of deterioration of (amount of error increase) the surface shape becomes about 20%. If the amount of shift exceeds 30%, the amount of deterioration of the surface shape rapidly increases. Accordingly, the amounts of positional shift are defined as being within ±30% and within 30%.

While the example embodiments of the disclosure have been described, the disclosure is not limited to these example embodiments, and can be modified and changed in various manners within the scope of the disclosure.

According to an aspect of the disclosure, it is possible to maintain the desired accuracy of mirror deformation and also reduce the number of actuators.

While the disclosure has been described with reference to example embodiments, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No. 2017-149540, filed Aug. 1, 2017, which is hereby incorporated by reference herein in its entirety.

What is claimed is:

1. An optical device comprising:
a mirror; and
a plurality of actuators configured to deform a shape of a reflecting surface of the mirror,
wherein the plurality of actuators are arranged on a plurality of concentric circles arranged in such a manner that the concentric circles are arranged denser as positions of the concentric circles are located farther from a center of the reflecting surface of the mirror, and at least some of the plurality of actuators are arranged at equal intervals in circumferential directions of the concentric circles, and
wherein each of the plurality of actuators is arranged at one of positions corresponding to each term of extrema of a rotationally symmetric component when a shape of the reflecting surface to be deformed is expanded in Zernike polynomials.

2. The optical device according to claim 1, wherein overall arrangement of the plurality of actuators is rotationally symmetric.

3. The optical device according to claim 1, further comprising a base plate,
wherein the plurality of actuators are arranged between a back surface of the mirror and the base plate.

4. The optical device according to claim 1, wherein the plurality of actuators are arranged on or near a boundary as an optical effective area of the mirror.

5. The optical device according to claim 1, wherein the mirror has a circular shape when viewed from a direction perpendicular to the reflecting surface at the center.

6. The optical device according to claim 1, wherein the reflecting surface of the mirror has any one of a planar shape, a concave shape, and a convex shape.

7. The optical device according to claim 1, wherein the plurality of actuators is arranged at a position corresponding to at least 9th term or 16th term when a shape of the reflecting surface to be deformed is expanded in Zernike polynomials.

8. A projection optical system for projecting a pattern of a mask onto a substrate, the projection optical system comprising an optical device including a mirror, and a plurality of actuators configured to deform a shape of a reflecting surface of the mirror,
wherein the plurality of actuators are arranged on a plurality of concentric circles arranged in such a manner that the concentric circles are arranged denser as positions of the concentric circles are located farther from a center of the reflecting surface of the mirror, and at least some of the plurality of actuators are arranged at equal intervals in circumferential directions of the concentric circles, and
wherein each of the plurality of actuators is arranged at one of positions corresponding to each term of extrema of a rotationally symmetric component when a shape of the reflecting surface to be deformed is expanded in Zernike polynomials.

9. An exposure apparatus for exposing a substrate, comprising a projection optical system for projecting a pattern of a mask onto the substrate,
wherein the projection optical system includes an optical device including a mirror, and a plurality of actuators configured to deform a shape of a reflecting surface of the mirror, and
wherein the plurality of actuators are arranged on a plurality of concentric circles arranged in such a manner that the concentric circles are arranged denser as positions of the concentric circles are located farther from a center of the reflecting surface of the mirror, and at least some of the plurality of actuators are arranged at equal intervals in circumferential directions of the concentric circles, and
wherein each of the plurality of actuators is arranged at one of positions corresponding to each term of extrema of a rotationally symmetric component when a shape of the reflecting surface to be deformed is expanded in Zernike polynomials.

10. A method for manufacturing an article, the method comprising:
exposing a substrate using an exposure apparatus for exposing the substrate;
developing the exposed substrate; and
manufacturing an article from the developed substrate,
wherein the exposure apparatus including a projection optical system for projecting a pattern of a mask onto the substrate,
wherein the projection optical system including an optical device including a mirror, and a plurality of actuators configured to deform a shape of a reflecting surface of the mirror,
wherein the plurality of actuators are arranged on a plurality of concentric circles arranged in such a manner that the concentric circles are arranged denser as positions of the concentric circles are located farther from a center of the reflecting surface of the mirror, and at least some of the plurality of actuators are arranged at equal intervals in circumferential directions of the concentric circles, and
wherein each of the plurality of actuators is arranged at one of positions corresponding to each term of extrema of a rotationally symmetric component when a shape of the reflecting surface to be deformed is expanded in Zernike polynomials.

* * * * *